United States Patent
Suzuki et al.

(10) Patent No.: US 11,079,680 B2
(45) Date of Patent: Aug. 3, 2021

(54) HIGH HEAT RESISTANCE RESIST COMPOSITION AND PATTERN FORMING METHOD USING THE SAME

(71) Applicant: AZ Electronic Materials (Luxembourg) S.a.r.l., Luxembourg (LU)

(72) Inventors: Masato Suzuki, Kakegawa (JP); Hiroshi Hitokawa, Kakegawa (JP); Tomohide Katayama, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 353 days.

(21) Appl. No.: 15/773,029

(22) PCT Filed: Nov. 2, 2016

(86) PCT No.: PCT/EP2016/001817
§ 371 (c)(1),
(2) Date: May 2, 2018

(87) PCT Pub. No.: WO2017/084742
PCT Pub. Date: May 26, 2017

(65) Prior Publication Data
US 2019/0033717 A1   Jan. 31, 2019

(30) Foreign Application Priority Data
Nov. 17, 2015  (JP) .............................. JP2015-224806

(51) Int. Cl.
*G03F 7/38*   (2006.01)
*G03F 7/038*  (2006.01)
*G03F 7/004*  (2006.01)
*G03F 7/40*   (2006.01)
*G03F 7/20*   (2006.01)

(52) U.S. Cl.
CPC .............. *G03F 7/38* (2013.01); *G03F 7/0045* (2013.01); *G03F 7/038* (2013.01); *G03F 7/0382* (2013.01); *G03F 7/2022* (2013.01); *G03F 7/40* (2013.01); *G03F 7/0048* (2013.01)

(58) Field of Classification Search
CPC ............. G03F 7/38; G03F 7/0382; G03F 7/40
See application file for complete search history.

(56) References Cited

U.S. PATENT DOCUMENTS

| | | | |
|---|---|---|---|
| 6,136,502 A | 10/2000 | Satoshi et al. | |
| 2003/0124456 A1 | 7/2003 | Shirakawa et al. | |
| 2007/0059632 A1* | 3/2007 | Oguro | G03F 7/0392 430/270.1 |
| 2012/0115084 A1* | 5/2012 | Okuyama | G03F 7/0382 430/281.1 |
| 2013/0052567 A1 | 2/2013 | Tsuchihashi | |
| 2015/0200090 A1* | 7/2015 | Chada | G03F 7/0047 438/694 |
| 2015/0284491 A1* | 10/2015 | Umino | C09D 125/18 525/328.8 |
| 2015/0325431 A1* | 11/2015 | Aoki | H01L 23/293 257/618 |

FOREIGN PATENT DOCUMENTS

| | | | | |
|---|---|---|---|---|
| EP | 1076261 A1 | 2/2001 | | |
| JP | H11190904 A | 7/1999 | | |
| JP | 2001-042539 A | 2/2001 | | |
| JP | 2001081137 A | 3/2001 | | |
| JP | 2003-122006 A | 4/2003 | | |
| JP | 2008274250 A | * | 11/2008 | ............... C08G 8/20 |
| JP | 2013-044808 A | 3/2013 | | |
| WO | WO-2010087516 A1 | 8/2010 | | |
| WO | WO-2012132676 A1 | 10/2012 | | |

OTHER PUBLICATIONS

International Search Report for PCT/EP2016/001817 dated Feb. 7, 2017.
Written Opinion of the International Searching Authority for PCT/EP2016/001817 dated Feb. 7, 2017.
International Preliminary Report on Patentability received for PCT Patent Application No. PCT/EP2016/001817, dated May 31, 2018, 10 pages.

* cited by examiner

*Primary Examiner* — John S Chu
(74) *Attorney, Agent, or Firm* — Faegre Drinker Biddle & Reath LLP

(57) ABSTRACT

[Problem] To provide a high heat resistance resist composition and a pattern formation method using the composition.
[Solution] The present invention provides a chemically amplified negative-type resist composition comprising a particular polymer and a particular crosslinking agent, and this composition makes it possible to form a resist pattern of high sensitivity, of excellent resolution and of strong heat-resistance.

14 Claims, No Drawings

HIGH HEAT RESISTANCE RESIST COMPOSITION AND PATTERN FORMING METHOD USING THE SAME

CROSS-REFERENCE TO RELATED APPLICATIONS

This application is a national stage application (under 35 U.S.C. § 371) of PCT/EP2016/001817, filed Nov. 2, 2016, which claims benefit of Japanese Application No. 2015-224806, filed Nov. 17, 2015, both of which are incorporated herein by reference in their entirety.

TECHNICAL FIELD

The present invention relates to a high heat resistance resist composition employed in semiconductor production processes. Specifically, the invention relates a high heat resistance resist composition for forming high-resolution patterns with exposure light of far UV rays of 300 nm or less, such as, KrF excimer laser beams (248 nm); and also relates to a pattern formation method using the composition

BACKGROUND ART

In extensive fields including the manufacture of semiconductor integrated circuits such as LSIs, the preparation of FPD screens, and the production of circuit boards for color filters, thermal heads and the like, photolithographic technologies have hitherto been adopted for microdevice production or for micro-fabrication. In a photolithographic process, a positive- or negative-type photosensitive resin composition (photoresist) is used for forming a resist pattern.

Heat resistance is one of the important properties of the photoresist in view of the photolithographic process, and specifically it is required for the photoresist to have high heat resistance. Actually, for example, polyimide-containing photoresists have high heat resistance, and hence photoresists containing polyimide or precursor thereof are often employed as i-line negative-type resists. However, polyimide is difficult to adopt as a KrF exposure resist capable of achieving high resolution, and accordingly it is desired to provide a high heat resistance resist suitable for KrF exposure.

As the KrF exposure resists having high heat-resistance, Patent documents 1 and 2 insist that resists disclosed therein are highly heat-resistant. Those documents show heat-resistance of the resists in the range of about 130 to 150° C., but are silent about the resistance at higher temperatures. Accordingly, as compared with heat-resistance of polyimide, there is still room for improvement.

PRIOR ART DOCUMENTS

Patent Documents

[Patent document 1] Japanese Patent Laid-Open No. 1999-190904
[Patent document 2] Japanese Patent Laid-Open No. 2001-081137

DISCLOSURE OF INVENTION

Problem to Be Solved By the Invention

In order to solve the above technical problem, the present invention provides a high heat resistance resist composition and a pattern formation method using the composition.

Means for Solving Problem

The chemically amplified negative-type resist composition according to the present invention comprises
(I) a polymer containing the repeating unit represented by the following formula (Ia):

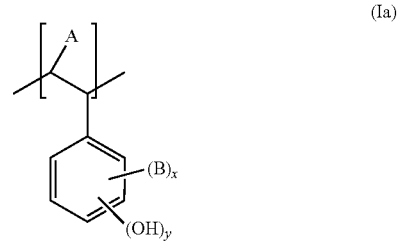

in which
A is hydrogen or a hydrocarbon group having 1 to 3 carbon atoms,
B is a hydrocarbon group having 1 to 5 carbon atoms, and
x and y are integers of 0 or more and 1 or more, respectively, under the condition of $x+y \leq 5$;
(II) a crosslinking agent represented by the following formula (IIa) or (IIb):

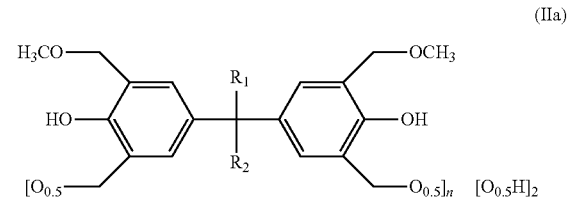

in which
n is an integer of 1 or more,
$R_1$ is a substituted or unsubstituted hydrocarbon group having 1 to 15 carbon atoms, and
$R_2$ is hydrogen, hydroxyl or a substituted or unsubstituted hydrocarbon group having 1 to 15 carbon atoms;

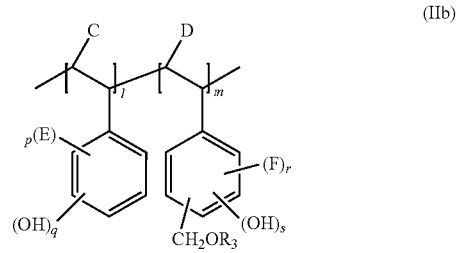

in which
l and m are numbers indicating the polymerization ratios provided that m is not equal to 0,
the repeating units of each side may be polymerized either randomly or to form blocks,
each of C and D is independently hydrogen or a hydrocarbon group having 1 to 3 carbon atoms,
each of E and F is independently a hydrocarbon group having 1 to 5 carbon atoms, $R_3$ is hydrogen or a hydrocarbon group having 1 to 4 carbon atoms, and p, q, s and r are integers of 0 or more, 1 or more, 1 or more, and 0 to 4 inclusive, respectively, under the conditions of $p+q \leq 5$ and $r+s \leq 4$;

(III) an acid generating agent; and (IV) a solvent.

Further, the negative pattern formation method according to the present invention comprises the steps of:

(1) coating a substrate with the chemically amplified negative-type resist composition according to the present invention, to form a composition layer;

(2) pre-baking said composition layer;

(3) exposing to light the substrate coated with the composition layer after said pre-baking step;

(4) carrying out post exposure baking after said exposure step; and (5) carrying out development with an alkali aqueous solution after said post exposure baking step.

Effect of the Invention

The chemically amplified negative-type resist composition of the present invention makes it possible to form a resist pattern of high sensitivity, of excellent resolution and heat-resistance. Specifically, the formed pattern can have a resolution of 100 to 300 nm, and can keep the pattern shape even after held at 350° C. for 60 seconds. Further, it also becomes possible to reduce fluctuation of the pattern width caused by standing wave generated in the resist composition layer when the pattern is formed.

DETAILED DESCRIPTION

Embodiments of the present invention will be described below in detail.

[Chemically Amplified Negative-Type Resist Composition]

The chemically amplified negative-type resist composition (hereinafter, often simply referred to as "composition") according to the present invention comprises a polymer, a crosslinking agent, an acid generating agent, and a solvent. Each component of the composition is explained as follows.

(I) Polymer

The composition of the invention comprises a polymer containing the repeating unit represented by the following formula (Ia):

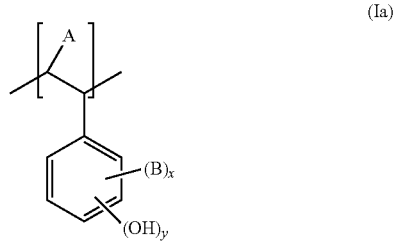

In the formula, A is hydrogen or a hydrocarbon group having 1 to 3 carbon atoms. Specifically, A is selected from the group consisting of hydrogen, methyl, ethyl, n-propyl and iso-propyl, and is preferably hydrogen.

Also, B is a hydrocarbon group having 1 to 5 carbon atoms. Specifically, B is selected from the group consisting of alkyl, cycloalkyl and alkenyl groups having 1 to 5 carbon atoms.

Further, x and y are integers of 0 or more and 1 or more, respectively, under the condition of $x+y \leq 5$.

The polymer may be a homopolymer comprising a single repeating unit represented by the formula (Ia), but it may be a copolymer comprising two or more kinds of repeating units represented by the formula (Ia). Further, it may be a copolymer containing a repeating unit other than the formula (Ia). In that case, the repeating unit other than the formula (Ia) is not particularly limited, but is preferably derived from styrene.

For example, the above polymer is preferably represented by the following formula (Ib):

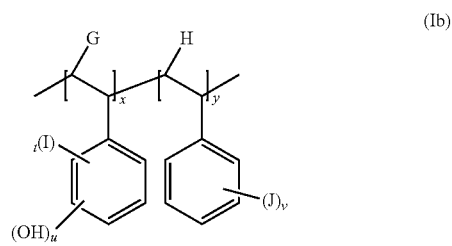

In the formula, each of G and H is independently hydrogen or a hydrocarbon group having 1 to 3 carbon atoms. Specifically, each of them is selected from the group consisting of hydrogen, methyl, ethyl, n-propyl and iso-propyl, and is preferably hydrogen.

Also, t and u are integers of 0 or more and 1 or more, respectively, under the condition of $t+u \leq 5$. Preferably, they satisfy the conditions of $t=0$ and $u=1$.

Further, each of I and J is independently a hydrocarbon group having 1 to 5 carbon atoms. Specifically, each of them is selected from the group consisting of alkyl, cycloalkyl and alkenyl groups having 1 to 5 carbon atoms.

Furthermore, v is an integer of 0 to 5 and is preferably 0.

The repeating units of each side may be polymerized either randomly or to form blocks, and x and y are numbers indicating the polymerization degrees provided that x is not equal to 0. The polymerization ratio of x:y is preferably 30:70 to 100:0, more preferably 87:13 to 100:0. It is preferred for y to satisfy the condition of y=0 because solubility in an alkali solution is enhanced.

The polymer used in the present invention may contain other repeating units, such as, repeating units having various functional groups, unless they impair the effect of the invention.

Further, the polymer used in the invention may be controlled to have any weight average molecular weight according the purpose. However, the weight average molecular weight is preferably 3000 to 30000, more preferably 5000 to 20000. Here, the "weight average molecular weight" means polystyrene-converted weight average molecular weight in the present invention.

Preferred examples of the polymer are shown below, but they by no means restrict the polymer.

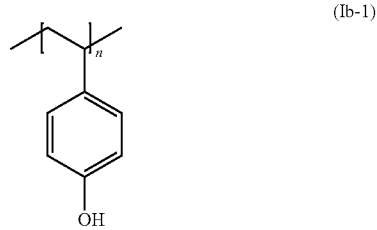

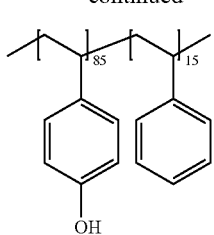
(Ib-2)

The polymer may be a mixture of two or more polymers represented by the formula (Ib). For example, the polymer may be either a homopolymer represented by the formula (Ib-1) or a mixture of the homopolymer and a polymer represented by the formula (Ib-2). The polymer mixture is preferred in view of DUV transmission.

(II) Crosslinking Agent

The composition of the present invention comprises a particular crosslinking agent.

As the crosslinking agent, compounds represented by the following formula (IIa) can be used in the present invention.

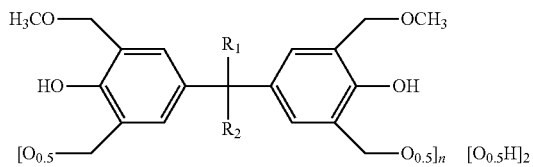
(IIa)

In the formula, $R_1$ is a substituted or unsubstituted hydrocarbon group having 1 to 15 carbon atoms, and $R_2$ is hydrogen, hydroxyl or a substituted or unsubstituted hydrocarbon group having 1 to 15 carbon atoms.

It is noted that the present invention does not include the case where $R_1$ is hydrogen. If both of $R_1$ and $R_2$ are hydrogens, the crosslinking agent is liable to decompose and hence is not adopted in the present invention. Accordingly, the pattern shape can be kept even under high temperature to form a high heat resistance pattern in the present invention.

If $R_1$ and $R_2$ in the formula (IIa) are hydrocarbon groups, they are preferably selected form the group consisting of alkyl, cycloalkyl, aryl, alkylaryl and arylalkyl groups. Those hydrocarbon groups may be substituted with hydroxyl, carboxyl groups, alkoxy groups, acyl groups, amino groups and the like.

In the formula (IIa), at least one of $R_1$ and $R_2$ is preferably an aryl group. Examples thereof include phenyl, tolyl, naphthyl, and anthracenyl.

Further preferably, at least one of $R_1$ and $R_2$ is a naphthyl group. If the crosslinking agent contains a naphthyl group, the composition layer is hardly affected by standing wave and consequently the resultant pattern has a nearly perpendicular sectional face.

In the formula (IIa), n is an integer of 1 or more, preferably 1 to 10 inclusive, more preferably 1 to 3 inclusive.

The crosslinking agent represented by the formula (IIa) has a weight average molecular weight of 300 to 2000, preferably 400 to 1500, more preferably 450 to 1000. The crosslinking agent represented by the formula (IIb) has a weight average molecular weight of 500 to 10000, preferably 500 to 5000, more preferably 500 to 2000.

Examples of the crosslinking agent represented by the formula (IIa) include 1-Bis[2,6-bis methoxymethyl(4-hydroxyphenyl)methyl]benzene, which is represented by the following formula:

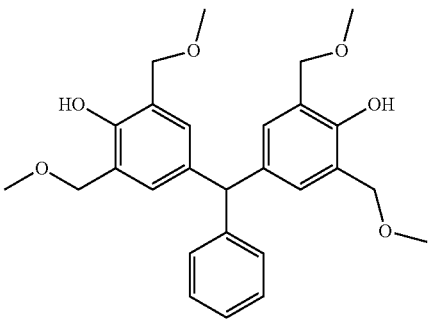

Further, another example of the crosslinking agent represented by the formula (IIa) is 1-Bis[2,6-bis methoxymethyl (4-hydroxyphenyl)methyl]naphthalene, which contains a naphthyl group and is represented by the following formula:

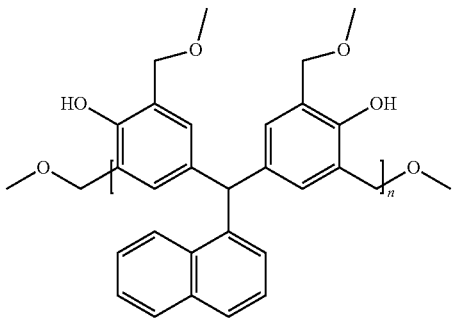

in which n is an integer of 1 to 3 and the average molecular weight is 500 to 800.

As the crosslinking agent, compounds represented by the following formula (IIb) can be also used in the present invention.

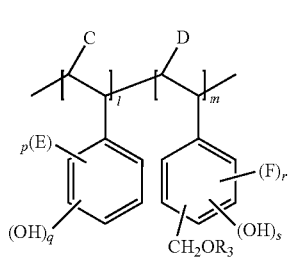
(IIb)

In the formula, each of C and D is independently hydrogen or a hydrocarbon group having 1 to 3 carbon atoms. Specifically, each of them is selected from the group consisting of hydrogen, methyl, ethyl, n-propyl and iso-propyl, and is preferably hydrogen.

Also, each of E and F is independently a hydrocarbon group having 1 to 5 carbon atoms. Specifically, each of them is selected from the group consisting of alkyl, cycloalkyl and alkenyl groups having 1 to 5 carbon atoms.

Further, $R_3$ is hydrogen or a hydrocarbon group having 1 to 4 carbon atoms, and is preferably selected from the group consisting of methyl, ethyl, iso-propyl and t-butyl groups. Among them, $R_3$ is particularly preferred to be methyl.

Furthermore, p is an integer of 0 or more, q and s are integers of 1 or more so that at least one hydrogen in a phenyl group is replaced with hydroxyl in each repeating unit, and r is an integer of 0 to 4 inclusive. They satisfy the conditions of $p+q \leq 5$ and $r+s \leq 4$.

In the formula, l and m are numbers indicating the polymerization degrees provided that m is not equal to 0. This means that the crosslinking agent necessarily contains an alkoxymethyl group represented by $-CH_2OR_3$. The repeating units of each side may be polymerized either randomly or to form blocks.

It is noted that the crosslinking agent represented by the formula (IIb) is characterized by having an alkoxymethyl group such as methoxymethyl and is different in this point from the aforementioned polymer (I). In the present invention, the "alkoxymethyl group" include hydroxymethyl, which corresponds to the case where $R_3$ is hydrogen. The alkoxymethyl group plays a vital role by forming a crosslinking site to the polymer in the crosslinking reaction when the pattern is formed from the composition.

The crosslinking agent of the formula (IIb) has a weight average molecular weight of generally 500 to 10000, preferably 500 to 5000, more preferably 500 to 2000.

The crosslinking agent represented by the formula (IIa) or (IIb) may be a mixture of the above polymers different in the polymerization degree or in the structure. For example, two or more polymers similarly represented by the formula (IIa) but having different weight average molecular weights can be used in a mixture. It is also possible to use a mixture of the crosslinking agent represented by the formula (IIa) and that represented by the formula (IIb).

The composition of the present invention contains the crosslinking agent of the formula (IIa) or (IIb) in an amount of generally 2 to 60 weight parts, preferably 5 to 30 weight parts, further preferably 6 to 15 weight parts, based on 100 weight parts of the polymer (I).

The above crosslinking agent shows various glass transition temperatures according to the structure thereof, but it is preferably in the range of 150 to 250° C. If having a glass transition temperature in that range, the crosslinking agent has the advantage of being well-soluble in a solvent, such as, propyleneglycol monomethyl ether acetate.

In the composition of the present invention, the crosslinking agent preferably has a particular decomposition temperature so as to obtain a pattern excellent in heat-resistance derived from the composition. Specifically, the crosslinking agent preferably comes to weigh zero when heated at a heating rate of 20° C./minute from room temperature to a decomposition temperature of 350 to 700° C.

(III) Acid Generating Agent

The acid generating agent used in the present invention can be freely selected from conventionally known agents. Examples thereof include onium salt compounds, crosslinkable onium salt compounds, sulfone maleimide derivatives, and disulfonyldiazomethane compounds.

Examples of the onium salt compounds include: iodonium salt compounds, such as, diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; sulfonium salt compounds, such as, triphenylsulfonium hexafluoroantimonate, triphenylsulfonium nonafluoro-n-butane sulfonate, triphenylsulfonium camphorsulfonate, and triphenylsulfonium trifluoromethanesulfonate; and crosslinkable onium salt compounds, such as, bis(4-hydroxyphenyl)(phenyl)sulfonium trifluoromethanesulfonate, bis(4-hydroxyphenyl)(phenyl)sulfonium 1,1,2,2,3,3,4,4-nonafluorobutane-1-sulfonate, phenylbis (4-(2-(vinyloxy) ethoxy)phenyl)sulfonium 1,1,2,2,3,3,4,4-octafluorobutane-1,4-disulfonate, and tris(4-(2-(vinyloxy) ethoxy)phenyl)sulfonium 1,1,2,2,3,3,4,4-octafluorobutane-1,4-disulfonate. Those, however, by no means restrict the invention.

Examples of the sulfone maleimide derivatives include: N-(trifluoromethanesulfonyloxy)succinimide, N-(nonafluoro-n-butanesulfonyloxy)succinimide, N-(camphorsulfonyloxy)succinimide, and N-(trifluoromethanesulfonyloxy)naphthalimide.

Examples of the disulfonyldiazomethane compounds include: bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane. Those can be used in combination of two or more in the composition of the invention.

The content of the acid generating agent is normally 1 to 50%, preferably 5 to 30%, more preferably 10 to 30%, based on the total weight of the polymer (I).

(IV) Solvent

Any solvent can be selected to use for the composition of the present invention as long as it can dissolve the above components. Examples of the solvent include: ethyleneglycol monomethyl ether, ethyleneglycol monoethyl ether, methylcellosolve acetate, ethylcellosolve acetate, diethyleneglycol monomethyl ether, diethyleneglycol monoethyl ether, propyleneglycol, propyleneglycol monomethyl ether, propyleneglycol monomethyl ether acetate, propyleneglycol propyl ether acetate, toluene, xylene, methyl ethyl ketone, cyclopentanone, cyclohexane, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. Those can be used in combination of two or more. Further, they can be used in mixture with high boiling point solvents, such as, propyleneglycol monobutyl ether and propyleneglycol monobutyl ether acetate.

The composition of the present invention contains the solvent in an amount of 50 to 95%, preferably 70 to 90%, more preferably 80 to 90%, based on the total weight of the composition.

The chemically amplified negative-type resist composition according to the present invention necessarily comprises the above components (I) to (IV), but can further contain other compounds, if necessary. Those substances additionally usable in combination with the indispensable components are described below. The amount of the components other than (I) to (IV) is preferably 5% or less, more preferably 2% or less, based on the total weight of the composition.

Examples of the additional components include surfactant, acid and base. Those should be used as far as they do not impair the effect of the present invention.

The surfactant is employed for the purposes of ensuring homogeneity of the composition and of improving coatability thereof. In order to make the surfactant fully work for improving surface roughness of the formed resist layer, the content of the surfactant is preferably 50 to 100000 ppm, more preferably 50 to 50000 ppm, further preferably 50 to 20000 ppm, based on the total weight of the composition. It is noted that, if the composition contains the surfactant too much, problems such as poor development may occur.

The acid or base is employed for the purposes of controlling the pH of the composition and of improving solubility of each component. In addition, the base can be added for the purpose of controlling the diffusion distance of acid generated in the exposure so as to improve the resolution, to control change of the sensitivity after the exposure and to reduce dependence on the substance and on the environment. The acid or base can be freely selected as far as it does not impair the effect of the invention. For example, carboxylic acids, amines and ammonium salts are employable. Those acids and bases include aliphatic acids, aromatic acids, primary amines, secondary amines, tertiary amines and ammonium compounds. They may be substituted with any substituents. Examples thereof include: formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine, and tetramethylammonium.

The composition according to the present invention may further contain germicide, antibacterial agent, preservative, and/or anti-mold agent. Those chemicals are added for the purpose of preventing bacteria or fungi from propagating in the composition with the passage of time. Examples thereof include alcohols, such as phenoxyethanol, and isothiazolone. Specifically, for example, Bestcide ([trademark], manufactured by Nippon Soda Co., Ltd.) can serve as particularly effective preservative, anti-mold agent or germicide. Those chemicals typically give no effect to the function of the composition, and are contained in an amount of normally 1% or less, preferably 0.1% or less, more preferably 0.001% or less, based on the total weight of the composition.

[Pattern Formation Method]

The pattern formation method of the present invention will be described below. The following is a typical process in which the composition of the invention is employed according to the pattern formation method.

First, the chemically amplified negative-type resist composition of the present invention is applied on a surface, which may be pretreated if necessary, of a substrate, such as a silicon or glass substrate, according to a known coating method such as spin-coating method, to form a composition layer. Prior to applying the resist composition, an antireflective coat may be beforehand formed thereunder. In addition or otherwise, an antireflective coat may be afterward formed over the composition layer.

The composition layer formed on the substrate is then subjected to heating referred to as "prebaking" on a hot plate or in a heating furnace, for example, to remove the solvent contained in the composition layer. The prebaking temperature depends on the substrate and the solvent. However, for example, when prebaked on a hot plate, the layer is heated at normally 20 to 200° C., preferably 50 to 150° C. for normally 30 to 300 seconds, preferably 30 to 120 seconds. As a result of the prebaking procedure, a resist film normally having a thickness of about 300 to 800 nm is obtained.

The resist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, post exposure baking (PEB) is carried out so as to promote the crosslinking reaction. As for the heating conditions, for example, when baked on a hot plate, the film is heated at 80 to 150° C., preferably 100 to 130° C. for 60 to 180 seconds, preferably 60 to 120 seconds.

Subsequently, development such as paddle development is carried out to form a resist pattern. The resist is normally developed with an alkali developer, which is, for example, an aqueous solution of potassium hydroxide or tetramethylammonium hydroxide (TMAH). After the development, the resist pattern is rinsed (washed) with a rinse solution. The thus formed pattern is employed as a resist for etching, plating, ion diffusion or dyeing, and thereafter peeled away, if necessary.

The pattern formation method according to the present invention is also particularly effective in producing a fine resist pattern having a high aspect ratio. Here, the "aspect ratio" means a ratio of height to width of the resist pattern. Accordingly, the pattern formation method of the present invention is preferably applied to a lithographic process for forming a fine resist pattern, that is, a lithographic process including an exposure step with a wavelength of 250 nm or shorter by use of a KrF excimer laser or an ArF excimer laser as the exposure light source or further with X rays or electron beams. In terms of pattern dimension, the method of the invention is preferably applied to a lithographic process for forming such a fine resist pattern that the width of line-and-space or size of contact hole is 400 nm or less, preferably 200 nm or less.

The present invention will be further explained by examples described below, but they by no means limit embodiments of the invention.

EXAMPLE 101

In propyleneglycol monomethyl ether acetate, 100 weight parts of Polymer P1, 10 weight parts of Crosslinking agent C3, 0.375 weight part of Acid generating agent A1 (TG TP-H, [trademark]) and 0.06 weight part of a surfactant (MEGAFAC R-2011 [trademark]) were dissolved and stirred. The solution was then filtrated through a 0.01 μm-filter to prepare a chemically amplified negative-type resist composition of Example 1.

The composition of Example 1 was applied by means of a spin coater (manufactured by Tokyo Electron Ltd.) on a silicon wafer beforehand treated with hexamethylenedisilazane, and then dried on a hot plate at 120° C. for 60 seconds to obtain a resist film of 550 nm thickness. Subsequently, the resist film was subjected to exposure through an exposure mask (contact hole: 250 nm, C/H=1:3) under the conditions of exposure wavelength=248 nm and numerical aperture NA=0.63 by use of an exposure system FPA-3000EX5 ([trademark], manufactured by Canon Inc.). After the exposure, the silicon wafer was heated on a hot plate at 120° C. for 60 seconds, and then paddle development was carried out for 30 seconds with a 2.38 wt % aqueous solution of tetramethylammonium hydroxide. After the development, rinse with pure water and then drying were carried out to obtain a resist pattern having a hole width of 250 nm.

Evaluation of Pattern Shape

A sectional face of the resist pattern was observed with a field emission type scanning electron microscope S-5500 ([trademark], manufactured by Hitachi High-Technologies Corporation), to evaluate and classify the pattern shape into the following grades.
A: The pattern had a proper resolution (100 to 300 nm, preferably 150 to 250 nm), and was not affected by standing wave.
B: The pattern was formed but affected by standing wave.
C: The pattern was not formed.

Evaluation of Heat Resistance

The formed pattern was heated on a hot plate at 350° C. for 60 seconds, and then its sectional face was observed with a field emission type scanning electron microscope S-5500 ([trademark], manufactured by Hitachi High-Technologies Corporation), to evaluate and classify the pattern shape into the following grades.
A: The pattern shape was maintained and the thickness was reduced by less than 10%.
B: The pattern shape was maintained and the thickness was reduced by 10% or more but less than 20%.
C: The pattern shape was maintained and the thickness was reduced by 20% or more.
D: The pattern shape was not maintained.

EXAMPLES 102 to 104 and COMPARATIVE EXAMPLES 101 and 102

In Examples 102 to 104 and Comparative examples 101 and 102, the procedure of Example 101 was repeated except for changing the polymer and the mixing ratio into those shown in Table 1. The results are shown in Table 1.

TABLE 1

| | Polymer | | | Crosslinking agent | Acid generating agent | Pattern | Heat |
|---|---|---|---|---|---|---|---|
| Examples | P1 | P2 | P3 | C3 | A1 | shape | resistance |
| Ex. 101 | 100 | — | — | 10 | 2.85 | B | A |
| Ex. 102 | 75 | 25 | — | 10 | 2.85 | B | A |
| Ex. 103 | 50 | 50 | — | 10 | 2.85 | B | A |
| Ex. 104 | 25 | 75 | — | 10 | 2.85 | B | A |
| Com. 101 | — | 100 | — | 10 | 2.85 | B | D |
| Com. 102 | — | — | 100 | 10 | 2.85 | C | — |

Polymer P1

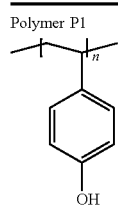

(Ib-1)

Polymer P2

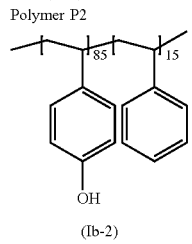

(Ib-2)

TABLE 1-continued

| | Polymer | | | Crosslinking agent | Acid generating agent | Pattern | Heat |
|---|---|---|---|---|---|---|---|
| Examples | P1 | P2 | P3 | C3 | A1 | shape | resistance |

Polymer P3

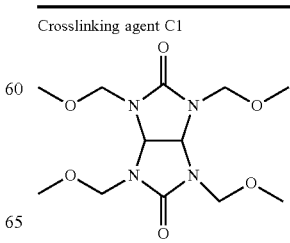

Crosslinking agent C3

Acid generating agent A1

EXAMPLE 201 and COMPARATIVE EXAMPLES 201 and 202

In Comparative examples 201, 202 and 203, the procedure of Example 101 was repeated except for changing the crosslinking agent into those shown in Table 2. The results are shown in Table 2.

TABLE 2

| | Polymer | Crosslinking agent | | | | Acid generating agent | | Heat |
|---|---|---|---|---|---|---|---|---|
| Examples | P1 | C1 | C2 | C3 | C4 | A1 | shape | resistance |
| Com. 201 | 100 | 10 | — | — | — | 2.85 | B | C |
| Com. 202 | 100 | — | 10 | — | — | 2.85 | C | D |
| Ex. 101 | 100 | — | — | 10 | — | 2.85 | B | A |
| Com. 203 | 100 | — | — | — | 10 | 2.85 | C | A |

Crosslinking agent C1

TABLE 2-continued

| Examples | Polymer P1 | Crosslinking agent C1 C2 C3 C4 | Acid generating agent A1 | Pattern shape | Heat resistance |
|---|---|---|---|---|---|

Crosslinking agent C2

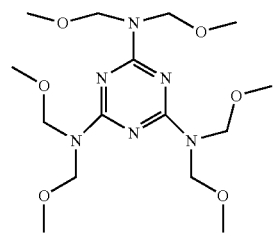

Crosslinking agent C4

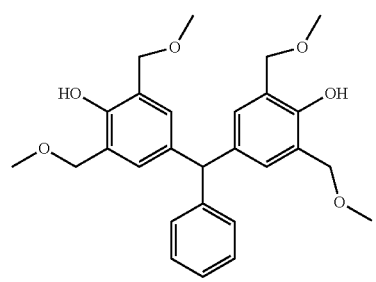

EXAMPLES 301 and 302

In Examples 301 and 302, the procedure of Example 101 was repeated except for changing the crosslinking agent into those shown in Table 3. The results are shown in Table 2.

TABLE 3

| Examples | Polymer P1 | Crosslinking agent C3 | Acid generating agent A1 | Pattern shape | Heat resistance |
|---|---|---|---|---|---|
| Ex. 302 | 100 | 7.5 | 2.85 | B | B |
| Ex. 101 | 100 | 10 | 2.85 | B | A |
| Ex. 301 | 100 | 12.5 | 2.85 | B | A |

EXAMPLES 401 and 402

In Examples 401 and 402, the procedure of Example 101 was repeated except for changing the acid generating agent into those shown in Table 4. The results are shown in Table 2.

TABLE 4

| Examples | Polymer P1 | Crosslinking agent C3 | Acid generating agent A1 | Acid generating agent A2 | Pattern shape | Heat resistance |
|---|---|---|---|---|---|---|
| Ex. 101 | 100 | 10 | 2.85 | — | B | A |
| Ex. 401 | 100 | 10 | 5.70 | — | B | A |
| Ex. 402 | 100 | 10 | — | 3.88 | A | A |

Acid generating agent A2

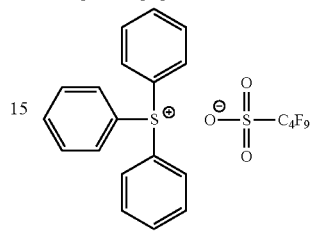

The invention claimed is:

1. A negative pattern formation method comprising the steps of coating a substrate with a chemically amplified negative-type resist composition comprising
   (I) a polymer containing the repeating unit represented by the following formula (Ia):

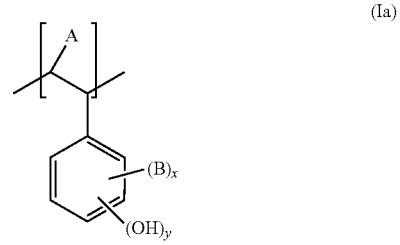

in which
A is hydrogen or a hydrocarbon group having 1 to 3 carbon atoms,
B is a hydrocarbon group having 1 to 5 carbon atoms, and
x is an integer of 0 or more,
y is an integer of 1 or more,
under the conditions of $x+y \leq 5$;
(II) a crosslinking agent represented by the following formula (IIa)

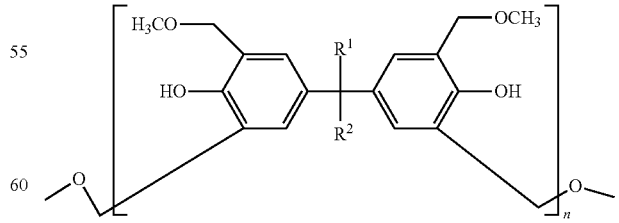

in which
n is an integer of 1 or more,
$R_1$ is a substituted or unsubstituted hydrocarbon group having 1 to 15 carbon atoms, and R2 is hydrogen, hydroxyl or a substituted or unsubstituted hydrocarbon group having 1 to 15 carbon atoms;
wherein at least one of said $R_1$ and R2 is a naphthyl group;
(III) an acid generating agent; and
(IV) a solvent, to form a composition layer;
(1) pre-baking said composition layer;
(2) exposing to light the substrate coated with the composition layer after said pre-baking step;
(3) carrying out post exposure baking after said exposure step; and
carrying out development with an alkali aqueous solution after said post exposure baking step.

2. The negative pattern formation method according to claim 1, wherein said polymer is represented by the following formula (Ib)

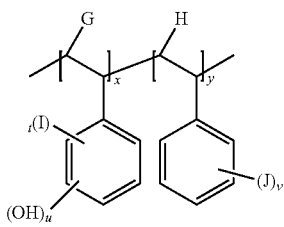

in which
x and y are numbers indicating the polymerization ratios provided that x is not equal to 0, the repeating units of each side may be polymerized either randomly or to form blocks,
each of G and H is independently hydrogen or a hydrocarbon group having 1 to 3 carbon atoms,
each of I and J is independently a hydrocarbon group having 1 to 5 carbon atoms, and t, an integer of 0 or more
u an integer of 1 or more and
v an integer of 0 to 5, under the condition of t+u<5.

3. The negative pattern formation method according to claim 2, wherein said polymer represented by the above formula (Ib) has a polymerization ratio x:y in the range of 87:13 to 100:0.

4. The negative pattern formation method according to claim 2, wherein said polymer represented by the above formula (Ib) has a polymerization ratio x:y in the range of 30:70 to 100:0.

5. The negative pattern formation method according to claim 2, wherein the polymerization ratio y is 0 in said polymer represented by the above formula (Ib).

6. The negative pattern formation method according to claim 1, wherein the content of said crosslinking agent is in the range of 5 to 30 weight parts based on 100 weight parts of said polymer (I).

7. The negative pattern formation method according to claim 1, wherein said n is an integer of 1 to 3 inclusive.

8. The negative pattern formation method according to claim 1, wherein said crosslinking agent represented by the formula (IIa) has a weight average molecular weight of 300 to 2000.

9. The negative pattern formation method according to claim 1, wherein said crosslinking agent has a glass transition temperature in the range of 150 to 250° C.

10. A negative pattern formation method comprising the steps of coating a substrate with a chemically amplified negative-type resist composition comprising (I) a polymer containing the repeating unit represented by the following formula (Ia):

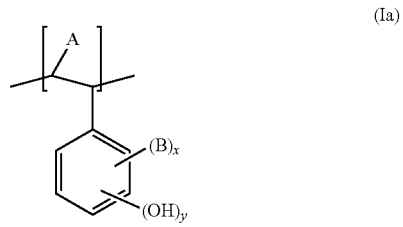

in which
A is hydrogen or a hydrocarbon group having 1 to 3 carbon atoms,
B is a hydrocarbon group having 1 to 5 carbon atoms, and
x is an integer of 0 or more,
y is an integer of 1 or more,
under the conditions of x+y<5;
(II) a crosslinking agent represented by the following formula (IIa)

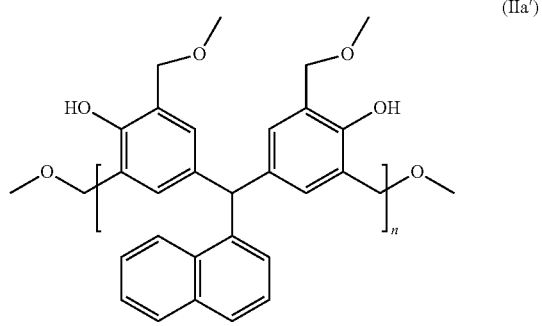

(IIa')
in which
n is an integer of 1 to 3 or has an average molecular weight of 500 to 800,
(Ill) an acid generating agent; and
(IV) a solvent, to form a composition layer;
(4) pre-baking said composition layer;
(5) exposing to light the substrate coated with the composition layer after said pre-baking step;
(6) carrying out post exposure baking after said exposure step; and
carrying out development with an alkali aqueous solution after said post exposure baking step.

11. The negative pattern formation method according to claim 10, wherein said polymer represented by the above formula (Ib) has a polymerization ratio x:y in the range of 30:70 to 100:0.

12. The negative pattern formation method according to claim 10, wherein the content of said crosslinking agent is in the range of 5 to 30 weight parts based on 100 weight parts of said polymer (Ia).

13. The negative pattern formation method according to claim 10, wherein said crosslinking agent represented by the formula (IIa) has a weight average molecular weight of 300 to 2000.

14. The negative pattern formation method according to claim 10, wherein said crosslinking agent has a glass transition temperature in the range of 150 to 250° C.

* * * * *